(12) United States Patent
Andrews et al.

(10) Patent No.: US 10,750,640 B2
(45) Date of Patent: Aug. 18, 2020

(54) TECHNIQUES FOR MITIGATING TEMPERATURE SPIKES AND DISSIPATING HEAT

(71) Applicant: QUALCOMM Incorporated, San Diego, CA (US)

(72) Inventors: Sean Charles Andrews, Solana Beach, CA (US); Seong Heon Jeong, Tuscaloosa, AL (US); William Henry Von Novak, III, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/118,654

(22) Filed: Aug. 31, 2018

(65) Prior Publication Data
US 2019/0159364 A1 May 23, 2019

Related U.S. Application Data

(60) Provisional application No. 62/587,674, filed on Nov. 17, 2017.

(51) Int. Cl.
*H05K 7/20* (2006.01)
*C09K 5/00* (2006.01)
(Continued)

(52) U.S. Cl.
CPC ......... *H05K 7/20381* (2013.01); *C09K 5/063* (2013.01); *G06F 1/206* (2013.01);
(Continued)

(58) Field of Classification Search
CPC ............. H05K 7/2029; H05K 7/20381; H05K 7/20409
See application file for complete search history.

(56) References Cited

U.S. PATENT DOCUMENTS

| 2010/0256708 | A1 | 10/2010 | Thornton et al. | |
| 2012/0180979 | A1* | 7/2012 | Harrington | F28D 1/0246 165/11.1 |
| 2016/0195320 | A1* | 7/2016 | Konovalov | F28D 20/023 62/99 |

OTHER PUBLICATIONS

Bernardin M., et al., "Tunable Heat Transfer with Smart Nanofluids," Physical Review E (Statistical, Nonlinear, and Soft Matter Physics), vol. 85, No. 6, Jun. 1, 2012 (Jun. 1, 2012), XP055545060, 5 pages, US ISSN: 1539-3755, DOI: 10.1103/PhysRevE.85.066321.

(Continued)

*Primary Examiner* — Mark A Connolly

(57) ABSTRACT

Disclosed is a method and apparatus for mitigating temperature spikes and dissipating heat. The apparatus for mitigating temperature spikes and dissipating heat comprises one or more heatsinks, one or more sensors, one or more phase change materials and one or more processors coupled to the one or more sensors. The one or more processors may be configured to obtain one or more sensor measurements and may be configured to determine whether to store heat or dissipate heat based on the one or more sensor measurements. In response to a determination to dissipate heat, the one or more processors may be configured to dissipate heat from the one or more processors, the one or more phase change materials or both using the one or more heatsinks. Furthermore, in response to a determination to store heat, store heat from the one or more processors using the one or more phase change materials.

36 Claims, 8 Drawing Sheets

(51) Int. Cl.
*G06F 1/20* (2006.01)
*C09K 5/06* (2006.01)
(52) U.S. Cl.
CPC ..... *H05K 7/20327* (2013.01); *H05K 7/20409* (2013.01); *H05K 7/20518* (2013.01); *H05K 7/20836* (2013.01); *G06F 2200/201* (2013.01)

(56) References Cited

OTHER PUBLICATIONS

International Search Report and Written Opinion—PCT/US2018/059893—ISA/EPO—dated Feb. 5, 2019.
Shima P.D., et al., "Magnetically Controllable Nanofluid with Tunable Thermal Conductivity and Viscosity," Applied Physics Letters, Sep. 30, 2009 (Sep. 30, 2009), 4 pages, XP055545084, DOI: 10.1063/1.3238551 Retrieved from the Internet: URL:https://aip.scitation.org/doi/pdf/10.1063/1.3238551?class=pdf [retrieved on Jan. 21, 2019].

* cited by examiner

TECHNIQUES FOR MITIGATING TEMPERATURE SPIKES AND DISSIPATING HEAT

CLAIM OF PRIORITY UNDER 35 U.S.C. § 119

This application claims under 35 USC § 119 the benefit of and priority to U.S. Provisional Application No. 62/587,674, filed Nov. 17, 2017, and entitled "TECHNIQUES FOR MITIGATING TEMPERATURE SPIKES AND DISSIPATING HEAT," which is assigned to the assignee hereof and are incorporated herein by reference in its entirety.

FIELD

This disclosure relates generally to techniques for temperature suppression and thermal dissipation and more particularly to techniques, methods and apparatuses for mitigating temperature spikes and opportunistically dissipating heat.

BACKGROUND

Current techniques for thermal management involves increasing the surface area of the heatsink or the thermal dissipation device. As an example, heatsinks may increase the number of fins that protrude from the heatsink so heat can quickly be moved away from a device, such as semiconductor. However, in some instances where the heatsink is not sufficient to move heat away from the device then the device must use techniques such as thermal throttling whereby the device must suspend or limit activities it is performing until the heat generation is below one or more thresholds.

Heatsinks are used to remove heat away from the semiconductor to avoid the semiconductor from becoming unstable and allow the semiconductor to continue to operate. Thermal management, beyond heatsinks, has become a new practice for personal computing via laptops but is also a concern for smartphones, etc. In smartphones, some techniques involve throttling the device's performance, moving computations and resource requests to different parts of the device (e.g. utilizing a second core central processing unit, or utilizing a graphics processing unit), etc. as ways to manage thermal dissipation.

SUMMARY

An example of an apparatus for mitigating temperature spikes and dissipating heat comprises one or more heatsinks, one or more sensors, one or more phase changer materials and one or more processors coupled to the one or more sensors. The one or more processors may be configured to obtain one or more sensor measurements. Additionally, the one or more processors may be configured to determine whether to store heat or dissipate heat based on the one or more sensor measurements. In response to a determination to dissipate heat, the one or more processors may be configured to dissipate heat from the one or more processors, the one or more phase change materials or both using the one or more heatsinks. Furthermore, in response to a determination to store heat, the one or more processors may be configured to store heat from the one or more processors using the one or more phase change materials.

An example method for mitigating temperature spikes and dissipating heat comprises obtaining one or more sensor measurements. Additionally, the method comprises determining whether to dissipate heat based on the one or more sensor measurements. In addition, the method comprises dissipating heat from the one or more processors, the one or more phase change materials or both based on the determination whether to dissipate heat.

An example of an apparatus for mitigating temperature spikes and dissipating heat comprises means for obtaining one or more sensor measurements. Additionally, the apparatus comprises means for determining whether to store heat or dissipate heat based on the one or more sensor measurements. In addition, the apparatus comprises in response to a determination to dissipate heat, means for dissipating heat from the one or more processors, the one or more phase change materials or both using the one or more heatsinks. Furthermore, the apparatus comprises in response to a determination to store heat, means for storing heat from the one or more processors using the one or more phase change materials.

An example of a non-transitory computer-readable medium for mitigating temperature spikes and dissipating heat comprising processor-executable program code configured to cause a processor to obtain one or more sensor measurements. Additionally, the processor-readable instructions configured to cause a processor to determine whether to store heat or dissipate heat based on the one or more sensor measurements. In response to a determination to dissipate heat, the processor-readable instructions configured to cause a processor to dissipate heat from the one or more processors, the one or more phase change materials or both using the one or more heatsinks. Furthermore, in response to a determination to store heat, the processor-readable instructions configured to cause a processor to store heat from the one or more processors using the one or more phase change materials.

BRIEF DESCRIPTION OF DRAWINGS

Non-limiting and non-exhaustive aspects are described with reference to the following figures, wherein like reference numerals refer to like parts throughout the various figures unless otherwise specified.

DETAILED DESCRIPTION

References throughout this specification to one implementation, an implementation, an embodiment, and/or the like mean that a particular feature, structure, characteristic, and/or the like described in relation to a particular implementation and/or embodiment is included in at least one implementation and/or embodiment of claimed subject matter. Thus, appearances of such phrases, for example, in various places throughout this specification are not necessarily intended to refer to the same implementation and/or embodiment or to any one particular implementation and/or embodiment. Furthermore, it is to be understood that particular features, structures, characteristics, and/or the like described are capable of being combined in various ways in one or more implementations and/or embodiments and, therefore, are within intended claim scope. However, these and other issues have a potential to vary in a particular context of usage. In other words, throughout the disclosure, particular context of description and/or usage provides helpful guidance regarding reasonable inferences to be drawn; however, likewise, "in this context" in general without further qualification refers to the context of the present disclosure.

The features and advantages of the disclosed method and apparatus will become more apparent to those skilled in the art after considering the following detailed description in connection with the accompanying drawing.

System and techniques herein provide for mitigating temperature spikes and dynamically controlling thermal dissipation.

Figure 1:
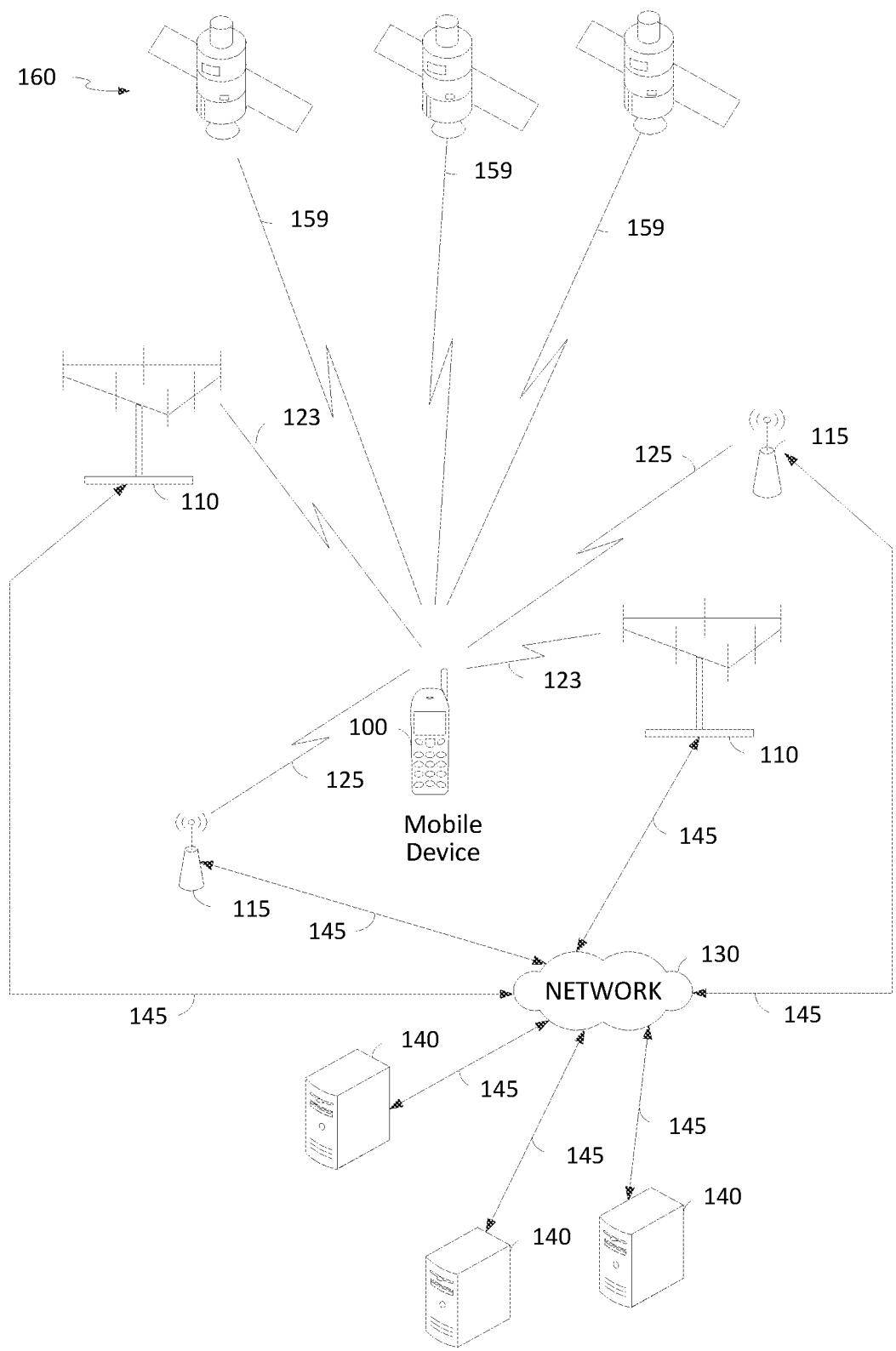
FIG. 1 shows an example of a communication environment in which various aspects of the disclosure may be implemented.

As shown in FIG. 1 in a particular implementation, mobile device 100, which may also be referred to as a UE (or user equipment), may transmit radio signals to, and receive radio signals from, a wireless communication network. In one example, mobile device 100 may communicate with a cellular communication network by transmitting wireless signals to, or receiving wireless signals from a cellular transceiver 110 which may comprise a wireless base transceiver subsystem (BTS), a Node B or an evolved NodeB (eNodeB) over wireless communication link 123. Similarly, mobile device 100 may transmit wireless signals to, or receive wireless signals from local transceiver 115 over wireless communication link 125. A local transceiver 115 may comprise an access point (AP), femtocell, Home Base Station, small cell base station, Home Node B (HNB) or Home eNodeB (HeNB) and may provide access to a wireless local area network (WLAN, e.g., IEEE 802.11 network), a wireless personal area network (WPAN, e.g., Bluetooth® network) or a cellular network (e.g. an LTE network or other wireless wide area network such as those discussed in the next paragraph). Of course, these are merely examples of networks that may communicate with a mobile device over a wireless link, and claimed subject matter is not limited in this respect.

Examples of network technologies that may support wireless communication link 123 are Global System for Mobile Communications (GSM), Code Division Multiple Access (CDMA), Wideband CDMA (WCDMA), Long Term Evolution LTE), High Rate Packet Data (HRPD), Orthogonal Frequency Division Multiplexing (OFDM) or similar, 5G. GSM, WCDMA and LTE are technologies defined by 3GPP. CDMA and HRPD are technologies defined by the 3$^{rd}$ Generation Partnership Project 2 (3GPP2). WCDMA is also part of the Universal Mobile Telecommunications System (UMTS) and may be supported by an HNB. Cellular transceivers 110 may comprise deployments of equipment providing subscriber access to a wireless telecommunication network for a service (e.g., under a service contract). Here, a cellular transceiver 110 may perform functions of a cellular base station in servicing subscriber devices within a cell determined based, at least in part, on a range at which the cellular transceiver 110 is capable of providing access service. Examples of radio technologies that may support wireless communication link 125 are IEEE 802.11, Bluetooth (BT) and LTE.

In a particular implementation, cellular transceiver 110 and local transceiver 115 may communicate with servers 140, 150 and/or 155 over a network 130 through links 145. Here, network 130 may comprise any combination of wired or wireless links and may include cellular transceiver 110 and/or local transceiver 115 and/or servers 140, 150 and 155. In a particular implementation, network 130 may comprise Internet Protocol (IP) or other infrastructure capable of facilitating communication between mobile device 100 and servers 140, 150 or 155 through local transceiver 115 or cellular transceiver 110. Network 130 may also facilitate communication between mobile device 100, servers 140, 150 and/or 155 and a public safety answering point (PSAP) 160, for example through communications link 165). In an implementation, network 130 may comprise cellular communication network infrastructure such as, for example, a base station controller or packet based or circuit based switching center (not shown) to facilitate mobile cellular communication with mobile device 100. In a particular implementation, network 130 may comprise local area network (LAN) elements such as WLAN APs, routers and bridges and may in that case include or have links to gateway elements that provide access to wide area networks such as the Internet. In other implementations, network 130 may comprise a LAN and may or may not have access to a wide area network but may not provide any such access (if supported) to mobile device 100. In some implementations network 130 may comprise multiple networks (e.g., one or more wireless networks and/or the Internet). In one implementation, network 130 may include one or more serving gateways or Packet Data Network gateways. In addition, one or more of servers 140, 150 and 155 may be an E-SMLC, Secure User Plane Location (SUPL) Location Platform (SLP), a SUPL Location Center (SLC), a SUPL Positioning Center (SPC), a Position Determining Entity (PDE) and/or a gateway mobile location center (GMLC), each of which may connect to one or more location retrieval functions (LRFs) and/or mobility management entities (MMES) in network 130.

In particular implementations, and as discussed below, mobile device 100 may have circuitry and processing resources capable of obtaining location related measurements (e.g. for signals received from GPS or other Satellite Positioning System (SPS) satellites 114, cellular transceiver 110 or local transceiver 115 and possibly computing a position fix or estimated location of mobile device 100 based on these location related measurements. In some implementations, location related measurements obtained by mobile device 100 may be transferred to a location server such as an enhanced serving mobile location center (E-SMLC) or SUPL location platform (SLP) (e.g. which may be one of servers 140, 150 and 155) after which the location server may estimate or determine a location for mobile device 100 based on the measurements. In the presently illustrated example, location related measurements obtained by mobile device 100 may include measurements of signals (124) received from satellites belonging to an SPS or Global Navigation Satellite System (GNSS) such as GPS, GLONASS, Galileo or Beidou and/or may include measurements of signals (such as 123 and/or 125) received from terrestrial transmitters fixed at known locations (e.g., such as cellular transceiver 110). Mobile device 100 or a separate location server may then obtain a location estimate for mobile device 100 based on these location related measurements using any one of several position methods such as, for example, GNSS, Assisted GNSS (A-GNSS), Advanced Forward Link Trilateration (AFLT), Observed Time Difference Of Arrival (OTDOA) or Enhanced Cell ID (E-CID) or combinations thereof. In some of these techniques (e.g. A-GNSS, AFLT and OTDOA), pseudoranges or timing differences may be measured at mobile device 100 relative to three or more terrestrial transmitters fixed at known locations or relative to four or more satellites with accurately known orbital data, or combinations thereof, based at least in part, on pilots, positioning reference signals (PRS) or other positioning related signals transmitted by the transmitters or satellites and received at mobile device 100. Here, servers 140, 150 or 155 may be capable of providing positioning assistance data to mobile device 100 including, for example, information regarding signals to be measured (e.g., signal timing), locations and identities of terrestrial transmitters and/or signal, timing and orbital information for GNSS satellites to facilitate positioning techniques such as A-GNSS, AFLT, OTDOA and E-CID. For example, servers 140, 150 or 155 may comprise an almanac which indicates locations and identities of cellular transceivers and/or local transceivers in a particular region or regions such as a particular venue, and may provide information descriptive of signals transmitted by a cellular base station or AP such as transmission power and signal timing. In the case of E-CID, a mobile device 100 may obtain measurements of signal strengths for signals received from cellular transceiver 110 and/or local transceiver 115 and/or may obtain a round trip signal propagation time (RTT) between mobile device 100 and a cellular transceiver 110 or local transceiver 115. A mobile device 100 may use these measurements together with assistance data (e.g. terrestrial almanac data or GNSS satellite data such as GNSS Almanac and/or GNSS Ephemeris information) received from a server 140, 150 or 155 to determine a location for mobile device 100 or may transfer the measurements to a server 140, 150 or 155 to perform the same determination.

A mobile device (e.g. mobile device 100 in FIG. 1) may be referred to as a device, a wireless device, a mobile terminal, a terminal, a mobile station (MS), a user equipment (UE), a SUPL Enabled Terminal (SET) or by some other name and may correspond to a cellphone, smartphone, laptop, tablet, PDA, tracking device or some other portable or moveable device, such as a moveable smart appliance. The mobile device may be a wearable device, such as a smart watch, smart clothing, head-mounted display (HMD), etc. It may also be a diagnostic device or a headless (e.g. without a display) device. The mobile device may be a stationary device, such as an access point, smart appliances, etc. Furthermore, the mobile device may be a partially implantable device or a fully implantable device that may be embedded within a person, such as under their skin, in their brain, etc (e.g. a medical implant).

Typically, though not necessarily, a mobile device may support wireless communication such as using GSM, WCDMA, LTE, CDMA, HRPD, WiFi, BT, WiMax, etc. A mobile device may also support wireless communication using a wireless LAN (WLAN), DSL or packet cable for example. A mobile device may comprise a single entity or may comprise multiple entities such as in a personal area network where a user may employ audio, video and/or data I/O devices and/or body sensors and a separate wireline or wireless modem. An estimate of a location of a mobile device (e.g., mobile device 100) may be referred to as a location, location estimate, location fix, fix, position, position estimate or position fix, and may be geographic, thus providing location coordinates for the mobile device (e.g., latitude and longitude) which may or may not include an altitude component (e.g., height above sea level, height above or depth below ground level, floor level or basement level). Alternatively, a location of a mobile device may be expressed as a civic location (e.g., as a postal address or the designation of some point or small area in a building such as a particular room or floor). A location of a mobile device may also be expressed as an area or volume (defined either geographically or in civic form) within which the mobile device is expected to be located with some probability or confidence level (e.g., 67% or 95%). A location of a mobile device may further be a relative location comprising, for example, a distance and direction or relative X, Y (and Z) coordinates defined relative to some origin at a known location which may be defined geographically or in civic terms or by reference to a point, area or volume indicated on a map, floor plan or building plan. In the description contained herein, the use of the term location may comprise any of these variants unless indicated otherwise.

Figure 2A:
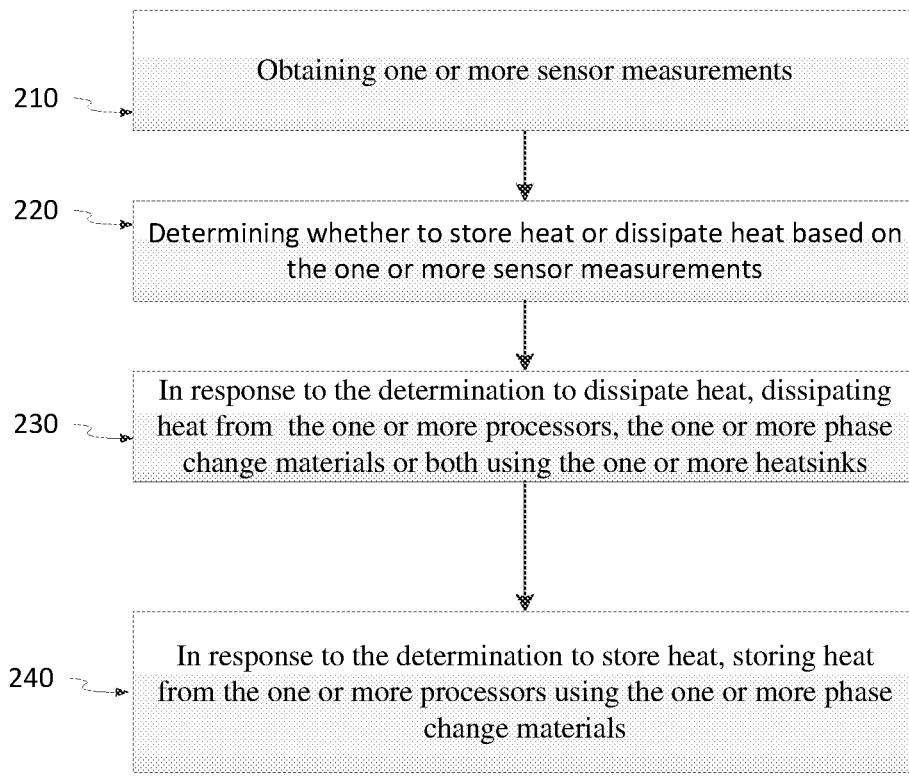
FIGS. 2A, 2B, and 2C shows a flow diagram illustrating an example method of mitigating temperature spikes and dynamically controlling thermal dissipation, according to some aspects of the disclosure.

FIG. 2A is a process diagram 200 illustrating an example method of mitigating temperature spikes and dynamically controlling thermal dissipation of a device 100.

At block 210, the device may obtain one or more sensor measurements. The sensor measurements may come from one or more of the same sensor type, one or more different sensor types or any combination thereof. As an example, the sensor measurements may come one or more sensors that can detect and/or determine: heart rate, blood blow, lymph flow, cerebrospinal flow, pulse shape, heatsink temperature, processor temperature, ambient temperature, gyroscope data, accelerometer data, one or more properties of the phase change material's (PCM), or any combination thereof. The properties of the PCM may include viscosity, transparency, conductivity, heat storage, temperature, or any combination thereof. The PCMs also include high heat capacity materials that do change forms, such as solid to liquid, etc.

At block 220, the one or more processors in the mobile device 100 can determine whether to store heat or dissipate heat based on the one or more sensor measurements. The one or more sensor measurements may be compared to one or more thresholds to determine whether to store heat or dissipate it. If the one or more sensor measurement indicates the pulse shape of the user and the device is an implantable device, then the device may use the pulse shape to determine when an artery will open up from constriction and the device may dissipate heat after the artery stops being constricted so the heat can quickly be carried away by the blood flow. Similarly, if the artery is being constricted the device may limit or mitigate heat dissipation to avoid harming that portion of the body and thus may store the heat via the PCM until blood flow increases. A similar process may be done for any fluid.

As an example, the heart rate or bodily fluid flow, such as blood flow, can be used to determine when the device can dissipate heat or increase heat dissipation, such as when blood flow increases.

In another example, the PCM's current heat storage amount may be compared to the PCM's (PCM) heat storage capability to determine whether or not to dissipate heat and estimate how much time before the PCM potentially needs to dissipate heat.

In an example for using gyroscope and/or accelerometer data, this data may be used to determine if the device is moving and movement may be correlated with an increase in heat or a need to dissipate heat, whereas the lack of movement may be correlated to store heat. It may also be configured to dissipate heat when there is no movement and store heat when there is movement, and it can be determined based on device type or can be configured a priori.

In an alternative implementation, the one or more processors in the mobile device 100 may determine whether to store heat or dissipate heat based on one or more rules. For example, there may be one or more rules that indicates when there is expected to be a large transfer data then the PCM stores heat and then dissipates it over a longer period of time. In another example, there may one or more rules that indicates when the one or more processors meet one or more temperature thresholds then the PCM stores the excess heat until the temperature drops below those thresholds or a different threshold and then the PCM dissipates the heat over a period of time.

These rules may be determined and/or calibrated a priori. For example, if the device is an implant and the heat generation may be user specific then the doctor may perform some calibration after implanting it into the user to determine the calibration values for when the PCM should be used to store heat and when it should dissipate the heat. The doctor may indicate user specific heat dissipation limits, specific user pulse shapes, etc. that may be provided so the device can use these user specific calibration values in the OEM specified rules.

According to an aspect of the disclosure, the one or more processors in the mobile device 100 can determine whether to store heat or dissipate heat, based on the one or more sensors and the one or more rules. This may be done according to the aspects discussed throughout the specification.

In one implementation, the device type may be used to determine whether to store or dissipate heat. For example, if the device is an implantable it may weigh more heavily or use sensor measurements from particular sensors, such as blood flow sensor, etc.

According to an aspect of the disclosure, the one or more sensor measurements may be used to determine an estimate time of when to dissipate heat and/or when to store heat. For example, the mobile device 100 may determine to dissipate heat; however, to optimize heat dissipation with little impact to the user or the surround environment, it may opportunistically dissipate the heat at a particular time, such as when blood flow increases, so it can estimate a time of when the blood flow may increase and wait until approximately the estimated time and then dissipate the heat.

According to one implementation, the one or more processors may determine an estimate time of when computations or high performance may be needed by the one or more processors or when heat generation may change and this may be a factor in determining whether to store or dissipate heat. For example, a processor may need to perform a relatively high number of computations which may trigger an estimate time of when heat dissipation may need occur.

The one or more processors may determine when the device may be receiving or transmitting wireless data and/or power and this may be used as a factor in determining whether or not to store or dissipate heat. For example, if the device is expecting to transfer a large amount of data it may determine beforehand to store heat from the processors/baseband as the data transfer is occurring and then dissipate the heat at a later time. This may also occur if the device is receiving wireless power and using it to charge the device's battery, the processors may determine whether to allow the heat generated from the power transfer to dissipate or to store it via the PCMs and then to opportunistically transfer the heat at a later time.

In the determination of whether to store or dissipate heat, the device may determine an estimation of heat generation that may occur by performing one or more tasks (e.g. data crunching, data transfer, power transfer, etc), and use the estimation of heat generations to make that determination. This estimation may be determined based on calibrated formula, historical data, temperature data, or any combination thereof.

In one implementation, the one or more sensor measurement may be used to determine an estimated amount of heat to dissipate and/or an estimate amount of heat to store. Each processor and/or PCM may have one or more discrete thermal contacts that can be coupled to the one or more heatsinks via one or more thermal paths, and each thermal contact may have an approximate expected heat dissipation rate. This information may be used to determine how many thermal contacts should be coupled to the one or more processors and/or PCM. The thermal contacts may be discrete or continuous and it may be the surface area that is in contact (or through an intermediary such as thermal paste) between the one or more heatsinks and the one or more processors and/or the PCM. For example, one or more thermal contacts may enable the one or more processors and/or PCM to dissipate heat at one watts per centimeter squared quarter ° C. per second, so if the mobile device 100 determines it has a short duration to cool down the one or more processors and/or the PCMs by ten watts per centimeter squared then it may determine it needs at least ten thermal contacts to be coupled to the one or more processors and/or the PCMs. The one or more discrete thermal contacts may have independent thermal paths to the one or more heatsinks, one or more processors, and/or the one or more PCMs, may have shared thermal paths or any combination thereof. In some implementations, the one or more thermal contacts may be the thermal path (without any intermediary) between the heatsink(s), processors(s) and the PCM(s).

Additionally, if there aren't discrete thermal contacts but one large continuous thermal contact then the mobile device 100 can determine the percentage of the continuous thermal contact that needs to be in contact with the one or more heatsinks, one or more processors and/or the PCM. For example, the rate of heat dissipation may be one watt per centimeter squared, so if the thermal contact can be adjusted in two dimensions then for the one or more processors and/or the PCM to reduce by five watts per centimeter squared within a short duration then the one or more processors and/or the PCM may need five centimeters squared of surface area to be in contact with the thermal contact.

According to aspects of the disclosure, there may be one or more thermal contacts and/or heatsinks with different heat transfer rates, so the one or more thermal contacts and/or heatsinks may be selected based on the heat transfer rate and the transfer amount needed over a particular duration.

At block 230, the mobile device 100 may dissipate heat from the one or more processors, the one or more PCMs or both using the one or more heatsinks in response to the determination to dissipate heat. The heatsinks, the one or more processors and/or the one or more PCMs may be coupled directly (e.g. at least a portion of the surface area of the one or more heat sinks is in contact with at least a portion of the surface area of the one or more processors), through proximity (e.g. at least a portion of the surface area of the one or more heat sinks is within proximity of at least a portion of the surface area of the one or more PCMs, and does not have to be in direct contact or does not have to have line of sight so it can be in proximity through one or more intermediaries), or through one or more intermediaries (e.g. at least a portion of the surface area of the one or more heatsinks in direct contact or in proximity with an intermediary and the intermediary is also in direct contact or in proximity with at least a portion of the surface area of one or more processors) or any combination thereof.

The heat may be dissipated by coupling the one or more heatsinks to the one or more processors, the one or more PCMs or both. The coupling of the one or more heatsinks with the one or more processors, the one or more PCMs or both may be done via one or more actuators, one or more nanofluids, or both.

The one or more actuators may move the one or more heatsinks, one or more processors and/or one or more PCMs so they are coupled either directly, through proximity or through one or more intermediaries. For example, the one or more processors may be coupled to one or more actuators and in response to determination to dissipate heat, the one or more actuators may be the one or more processors from a first location, where they are not coupled to the one or more heatsinks, to a second location where they are coupled to the one or more heatsinks.

In one implementation, the one or more actuators may move one or more intermediaries to enable thermal conductivity coupling (e.g. thermal coupling) of the one or more heatsinks, one or more processors and/or one or more PCMs. As an example, there may be one or more intermediary devices that has at least a portion of a surface area that can aid in transferring heat and a second portion of a surface area (or a different intermediary) that can mitigate or eliminate heat transfer, and these intermediaries may be coupled to the one or more actuator so in response to the determination to dissipate heat it may move the intermediary from a first location that enables insulation (e.g. mitigating heat transfer) to a second location that enables heat transfer or thermal conductivity coupling of the one or more heat sinks and the one or more processors and/or one or more PCMs.

One or more nanofluids may be adjusted to increase or decrease thermal conductivity to enable thermal coupling of the one or more heatsinks, one or more processors and/or one or more PCMs. The one or more nanofluids may be directly coupled, coupled via proximity and/or through one or more intermediaries, wherein the coupling may be thermally coupled and/or physically coupled.

These nanofluids may be controlled in some manner to adjust the thermal conductivity. For example, a voltage or current may be used to control the thermal conductivity of the nanofluids, such as an increase of current may increase the thermal conductivity of the nanofluid whereas a decrease or no current may decrease the thermal conductivity of the nanofluid so it acts like an insulator. In another example, the nanofluids may be controlled via a magnetic field, so when the magnetic field increases the thermal conductivity may increase and when the magnetic field decreases or the polarity changes then the thermal conductivity may decrease thereby acting as an insulator.

At block 240, the mobile device 100 may store heat the one or more processors using the one or more PCMs in response to the determination to store heat. This may be done to transfer heat away from the one or more processors so it can continue to function while it is generating excessive heat, but it also allows the one or more processors to control store the heat until it can opportunistically scheduling heat dissipation when it is eventually coupled to the one or more heatsinks.

There may be multiple modes for heat transfer that are provided within the mobile device 100, such as a mode for dissipating heat, a mode for dissipating some heat and storing some heat and a mode for storing heat. There may be scenarios where the mobile device 100 will need to store heat and dissipate heat, such as when dissipating the heat will release too much heat into the surrounding environment that may cause harm to the environment or violate a rule for the limit of heat to provide to the surrounding environment during a time period. As an example, if the mobile device 100 was an implantable device then providing too much heat within a time period may cause damage to the tissue surrounding the implant so in that scenario it may be ideal to thermally couple the one or more processors to the one or more PCM, have the one or more processors thermally coupled to one or more heatsinks, but insulate or mitigation heat transfer between one or more PCMs and the one or more heatsinks. This allows the processors to remove heat from itself and when it is time to dissipate heat from the PCMs then the PCMs may be thermally coupled to the one or more heat sinks.

Figure 2B:
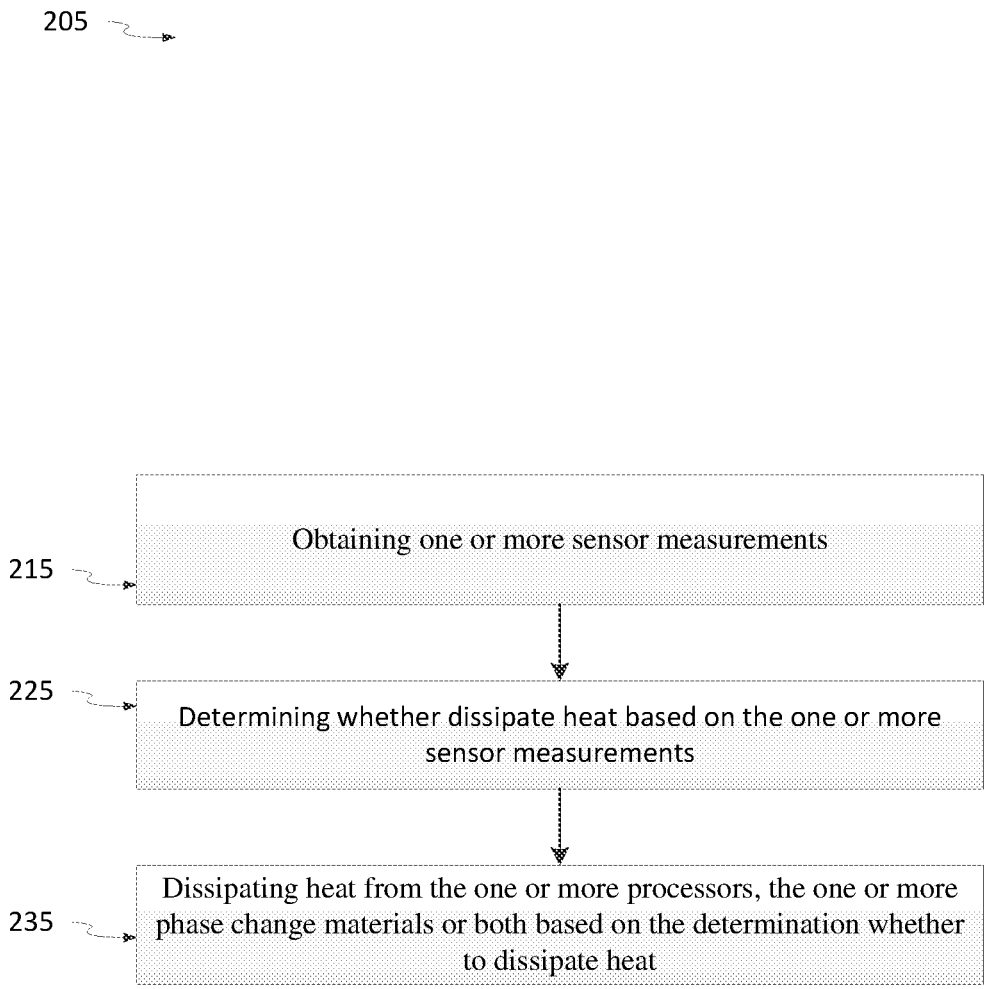

FIG. 2B is a process diagram 205 illustrating an example method of mitigating temperature spikes and dynamically controlling thermal dissipation of a device 100.

Blocks 215 and 225 are similar to blocks 210 and 220, respectively.

At block 225, the mobile device 100 may determine whether to dissipate heat based on the one or more sensor measurements.

At block 235, the mobile device 100 may dissipate heat from the one or more processors, the one or more phase change materials or both based on the determination whether to dissipate heat.

Figure 2C:
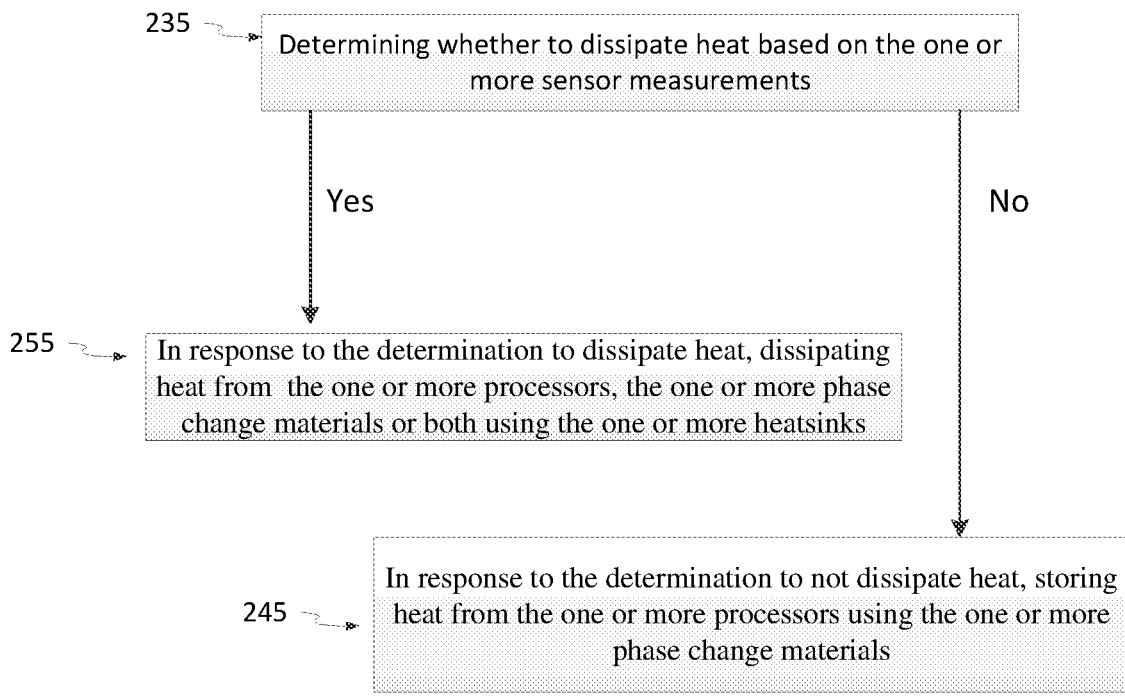

FIG. 2C is a process diagram 250 illustrating an example method of mitigating temperature spikes and dynamically controlling thermal dissipation of a device 100. Process diagram 250 is a continuation of FIG. 2B, which is indicated by block 235 in both FIG. 2B and FIG. 2C.

If the determination is to dissipate heat, the mobile device 100 proceeds to block 255 and dissipates heat from the one or more processors, the one or more phase change materials or both using the one or more heatsinks. For example, if the determination is to dissipate heat, then the mobile device may dissipate heat from the one or more processors to one or more phase change materials, one or more heatsinks or both. In another example, if the determination is to dissipate heat, the mobile device 100 may dissipate heat from the one or more phase change materials to the one or more heatsinks. In an additional example, if the determination is to dissipate heat, the mobile device 100 may dissipate heat from the one or more processors and the one or more phase change materials to the one or more heatsinks. This is similar to block 230 in FIG. 2A.

If the determination is to not dissipate heat, the mobile device 100 proceeds to block 245 and the mobile device 100 stores heat from the one or more processors using the one or more phase change materials. This means the mobile device 100 may at least partially store the heat internally to the mobile device 100 by storing the heat from the one or more processors using the one or more phase change materials. For further clarification, this means one or more processors dissipates heat to the one or more phase change material, but it is at least partially storing this heat internal to the mobile device 100. This is similar to block 240 in FIG. 2A.

Figure 3A:
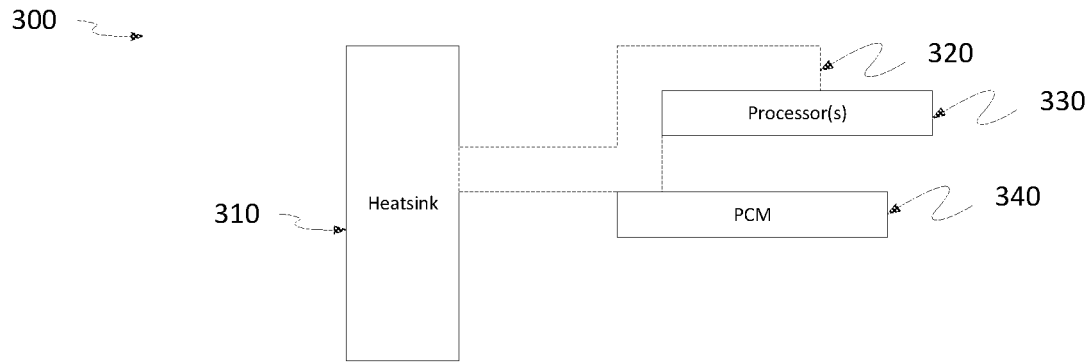
FIG. 3A, FIG. 3B, FIG. 3C show examples of a using one or more actuators or one or more nanofluids in a device to mitigating temperature spikes and dynamically controlling thermal dissipation.

FIG. 3A shows an example of a dissipation mode for a device that uses one or more actuators to mitigate temperature spikes and dynamically control thermal dissipation. In the example 300, the one or more actuators move the one or more processors 330 to be coupled to the thermal contact 320. The thermal contact 320 is coupled to the one or more heatsinks 310, and the one or more actuators may move the PCMs 340 to be coupled to the thermal contact 320. It is important to note that the PCMs 340 may be coupled to different thermal contacts 320 with the same heatsink that is being used by the one or more processors 330, it may be coupled to a different thermal contact 3 41020 that is coupled to a different heatsink 310 or any combination thereof. In the example 300, the one or more actuators move the PCMs 340 so it is coupled to a second location of the thermal contact 320 that is different from the first location where the one or more processors 330 is coupled or is expected to be coupled to when the dissipation mode is activated.

Figure 3B:
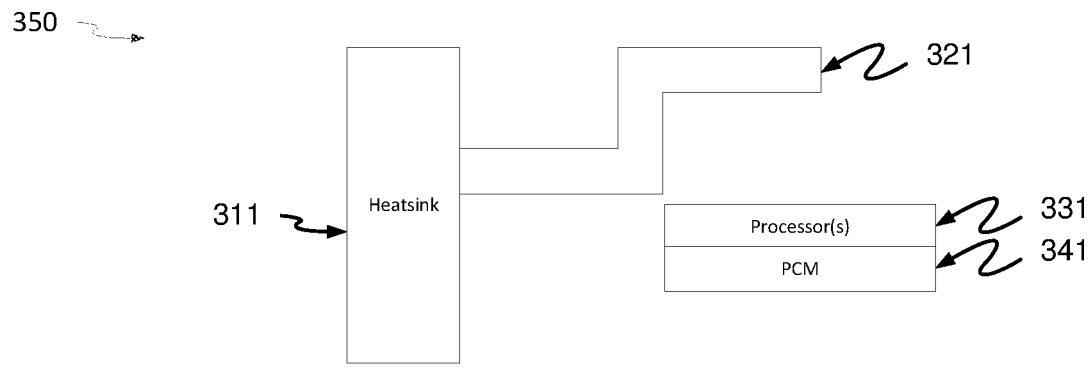

FIG. 3B shows an example of a store mode for a device that uses one or more actuators to mitigate temperature spikes. In the example 350, the one or more actuators move the PCMs 341 to a first location that is not coupled to the thermal contact 321 and therefore not coupled to the one or more heatsinks 311. Additionally, the one or more processors 331 are moved by the actuators to a second location that is not coupled to the thermal contact 321 and therefore not coupled to the one or more heatsinks 311, but is in contact or thermally coupled to the PCMs 341. In the example 300, the processors 331 and PCMs 341 are insulated from the heatsinks and the heat transfer away from the processors 331 and PCMs 341 is mitigated. This allows the device to store the heat until there is a better time to dissipate the heat away from the one or more processors and/or PCMs.

Figure 3C:
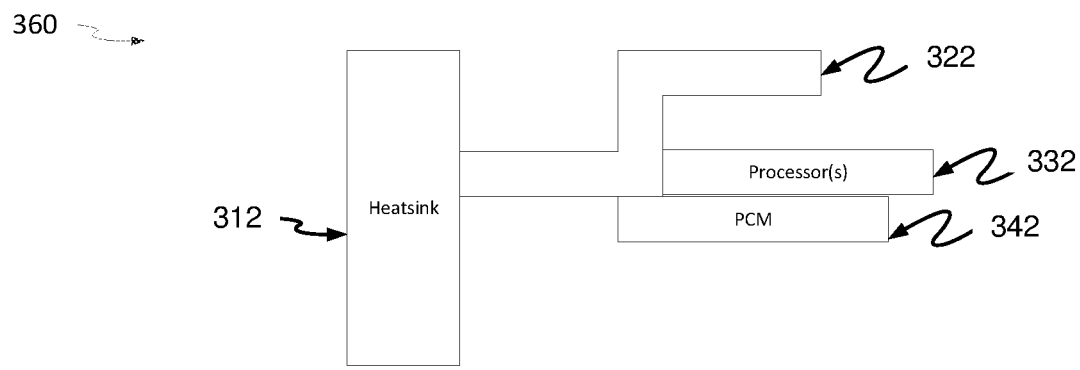

FIG. 3C shows an example of a store and dissipate mode for a device that uses one or more actuators to mitigate temperature spikes and dynamically control thermal dissipation. In the example 360, the one or more actuators move the PCMs to be coupled with the thermal contact 322 at a first location so that it is coupled to the one or more heatsinks 312. In an implementation, the PCMs 342 may be moved to a different location so that the PCMs 342 are not coupled to the thermal contact 322 and therefore insulated from the one or more heatsinks 312. The one or more actuators may move the one or more processors 33:2 to be coupled with the thermal contact 322 at a second location so that it is coupled to the one or more heatsinks 312 to allow it to dissipate some heat away from the processors, and it allows the one or more processors 332 to be coupled to the PCMs 342 so that the extra heat that is provided by the processors 332 may be stored via the PCMs 342 to allow the device to dissipate the heat away from the one or more processors and/or PCMs at a better time.

Figure 4:
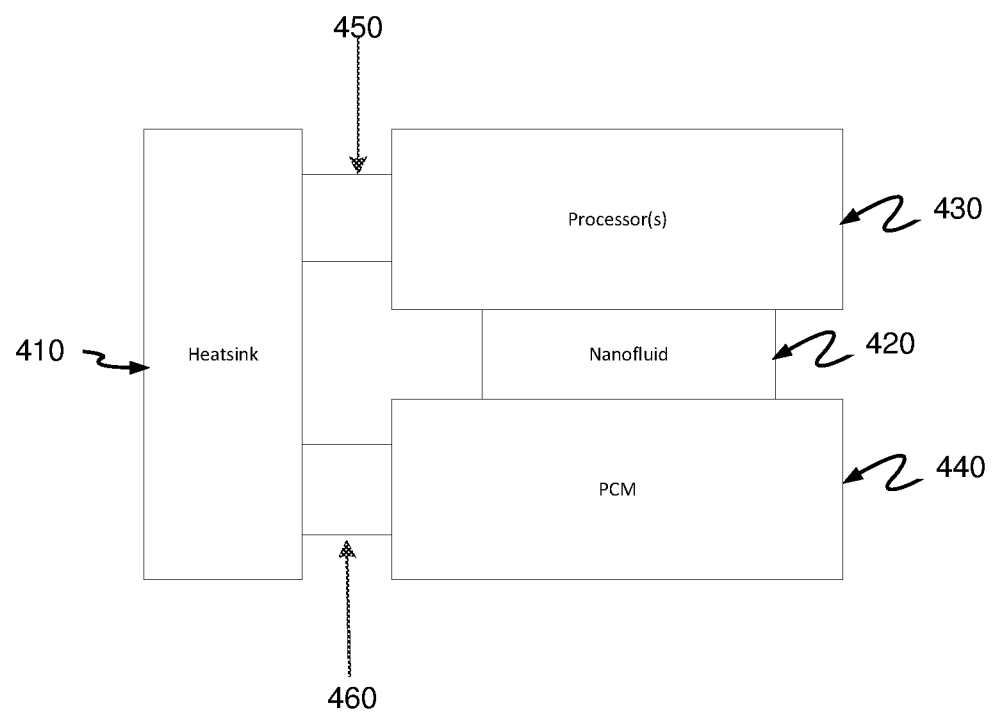
FIG. 4 is block diagram of an example mobile device and the components within the mobile device in which aspects of the disclosure may be implemented.

FIG. 4 shows an example schematic of a device 400 that includes nanofluids. The heatsinks 410 are coupled to nanofluid 450 and nanofluid 460. As described in this specification, the nanofluids 450 and 460 may be controlled in one or more ways, such as voltage control. The nanofluids 450 is coupled to the processor 430, and when the nanofluid 450 is tuned to be thermally conductive then the processor 430 dissipates its heat through the heatsink 410, but if the nanofluid 450 is tuned to reduce or mitigate the thermal conductivity then the nanofluid 450 acts like an insulator. The nanofluids 460 is also coupled to the PCMs 440 so when the nanofluid 460 is tuned to be thermally conductive then the PCM 440 dissipates its heat through the heatsink 410, and when the nanofluid 460 is tuned to reduce or mitigate the thermal conductivity then the nanofluid 460 acts like an insulator. Nanofluid 420 is coupled to the processor 430 and the PCM 440, and when the nanofluid 420 is tuned to be thermally conductive then the processor 430 is thermally coupled to the PCM 440 via the nanofluid 420 and the heat generated by the processor 430 is stored at the PCM 440.

Figure 5:
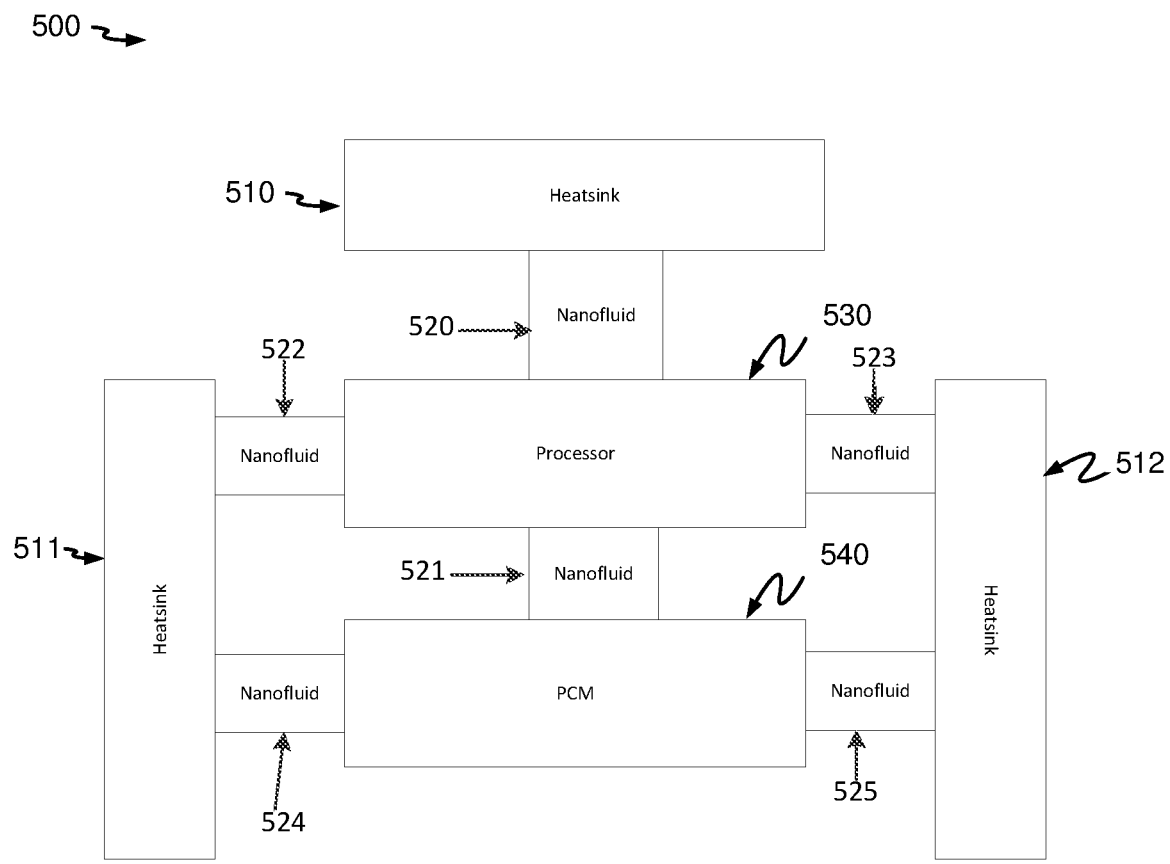
FIG. 5 shows an example schematic of a device 500 that includes multiple selectable heatsinks

FIG. 5 shows an example schematic of a device 500 that includes multiple selectable heatsinks. The processor 530 is coupled to multiple nanofluids 520, 522, 523 and the nanofluid 520, 522, 523 are coupled to heatsink 510, 511, 512 respectively. The processor 530 may determine which heatsink 510, 511, 512 (and therefore identify which nanofluid 520, 522, 523 to use to couple to the corresponding heatsink) to use based on the last time each heatsink has been used, the ambient conditions (such as temperature) in the area in proximity to the heatsink, the temperature at each heatsink, if a user is touching an area in proximity to the heatsink, current heat storage amount at the one or more processors 530 or any combination thereof.

The processor 530 also coupled to nanofluid 521 and the nanofluid 521 is coupled to PCM 540, which allows the PCM 540 to store heat from the processor 530 when the nanofluid 521 is configured to enable thermal conductivity.

The PCM 540 is coupled to nanofluids 524, 525 and the nanofluids 524,525 are coupled to heatsinks 511, 512 respectively. The processor 530 may determine which heatsink should be thermally coupled to the PCM 540 by enabling thermal conductivity in the corresponding nanofluid. For example, if the processor 530 may determine that heatsink 512 should be used to dissipate heat away from the PCM 540 so it may, increase the thermal conductivity in the nanofluid 525.

Figure 6:
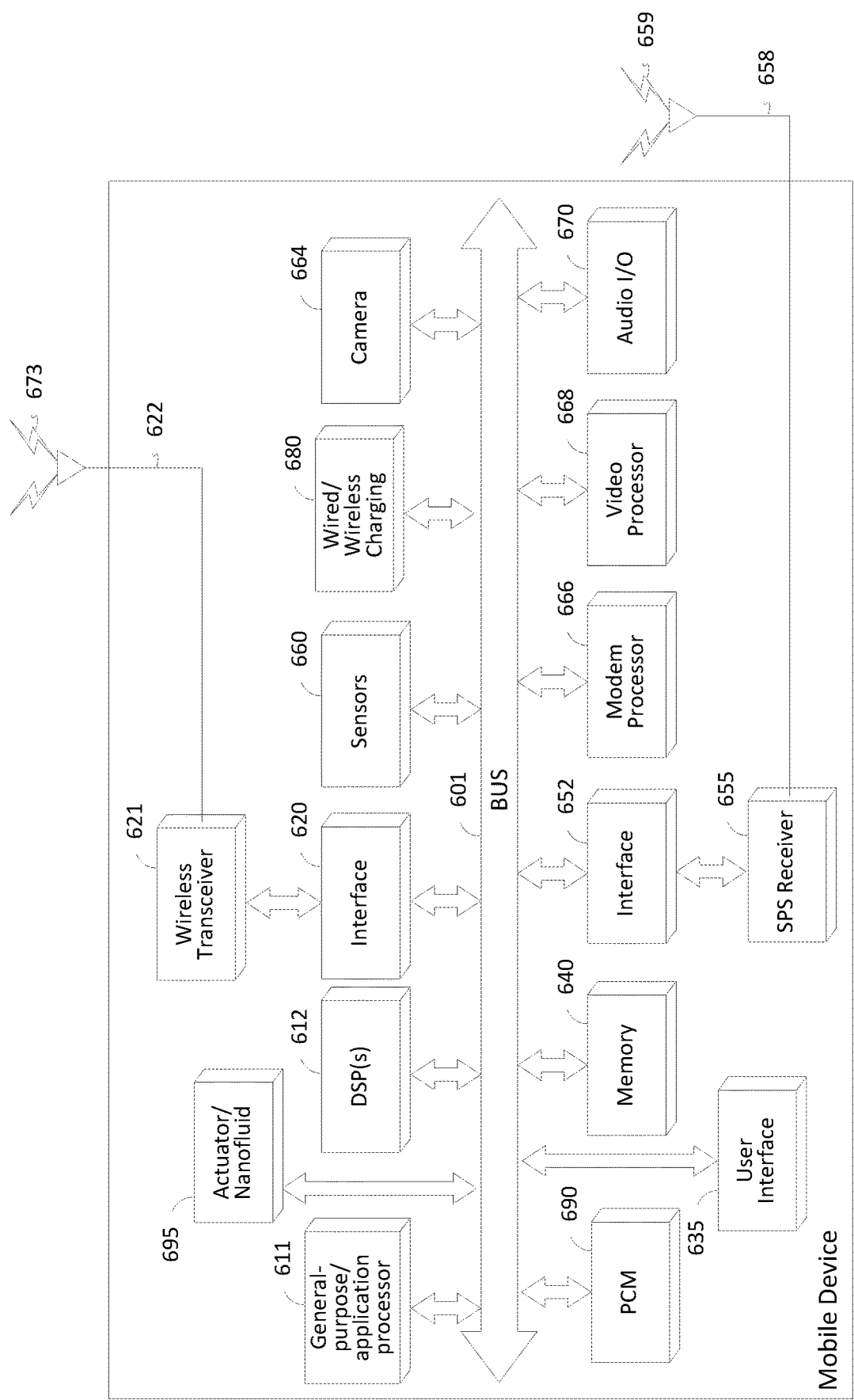
FIG. 6 is a schematic diagram of a mobile device 600 according to an implementation.

FIG. 6 is a schematic diagram of a mobile device 600 according to an implementation. Mobile device 100 shown in FIG. 1 may comprise one or more features of mobile device 600 shown in FIG. 5. In certain implementations, mobile device 600 may comprise a wireless transceiver 621 which is capable of transmitting and receiving wireless signals 623 via wireless antenna 622 over a wireless communication network. Wireless transceiver 621 may be connected to bus 601 by a wireless transceiver bus interface 620. Wireless transceiver bus interface 620 may, in some implementations be at least partially integrated with wireless transceiver 621. Some implementations may include multiple wireless transceivers 621 and wireless antennas 622 to enable transmitting and/or receiving signals according to corresponding multiple wireless communication standards such as, for example, versions of IEEE Standard 802.11, CDMA, WCDMA, LTE, UMTS, GSM, AMPS, Zigbee, Bluetooth and a 5G or NR radio interface defined by 3GPP, just to name a few examples. In a particular implementation, wireless transceiver 621 may transmit signals on an uplink channel and receive signals on a downlink channel as discussed above.

Mobile device 600 may also comprise SPS receiver 655 capable of receiving and acquiring SPS signals 659 via SPS antenna 658 (which may be integrated with antenna 622 in some implementations). SPS receiver 655 may also process, in whole or in part, acquired SPS signals 659 for estimating a location of mobile device 600. In some implementations, general-purpose processor(s) 611, memory 640, digital signal processor(s) (DSP(s)) 612 and/or specialized processors (not shown) may also be utilized to process acquired SPS signals, in whole or in part, and/or calculate an estimated location of mobile device 600, in conjunction with SPS receiver 655. Storage of SPS or other signals (e.g., signals acquired from wireless transceiver 621) or storage of measurements of these signals for use in performing positioning operations may be performed in memory 640 or registers (not shown). General-purpose processor(s) 611, memory 640, DSP(s) 612 and/or specialized processors may provide or support a location engine for use in processing measurements to estimate a location of mobile device 600. In a particular implementation, all or portions of actions or operations set forth for in process 200, 205, 250 may be executed by general-purpose processor(s) 611 or DSP(s) 612 based on machine-readable instructions stored in memory 640.

Also shown in FIG. 6, digital signal processor(s) (DSP(s)) 612 and general-purpose processor(s) 611 may be connected to memory 640 through bus 601. A particular bus interface (not shown) may be integrated with the DSP(s) 612, general-purpose processor(s) 611 and memory 640. In various implementations, functions may be performed in response to execution of one or more machine-readable instructions stored in memory 640 such as on a computer-readable storage medium, such as RAM, ROM, FLASH, or disc drive, just to name a few example. The one or more instructions may be executable by general-purpose processor(s) 611, specialized processors, or DSP(s) 612. Memory 640 may comprise a non-transitory processor-readable memory and/or a computer-readable memory that stores software code (programming code, instructions, etc.) that are executable by processor(s) 611 and/or DSP(s) 612. The processor(s) 611 and/or the DSP(s) 612 may be used to perform various operations as described throughout the specification.

Also shown in FIG. 6, a user interface 635 may comprise any one of several devices such as, for example, a speaker, microphone, display device, vibration device, keyboard, touch screen, just to name a few examples. In a particular implementation, user interface 635 may enable a user to interact with one or more applications hosted on mobile device 600. For example, devices of user interface 635 may store analog or digital signals on memory 640 to be further processed by DSP(s) 612 or general purpose processor 611 in response to action from a user. Similarly, applications hosted on mobile device 600 may store analog or digital signals on memory 640 to present an output signal to a user. In another implementation, mobile device 600 may optionally include a dedicated audio input/output (I/O) device 670 comprising, for example, a dedicated speaker, microphone, digital to analog circuitry, analog to digital circuitry, amplifiers and/or gain control. It should be understood, however, that this is merely an example of how an audio I/O may be implemented in a mobile device, and that claimed subject matter is not limited in this respect. In another implementation, mobile device 600 may comprise touch sensors 662 responsive to touching or pressure on a keyboard or touch screen device.

Mobile device 600 may also comprise a dedicated camera device 664 for capturing still or moving imagery. Camera device 664 may comprise, for example an imaging sensor (e.g., charge coupled device or CMOS imager), lens, analog to digital circuitry, frame buffers, just to name a few examples. In one implementation, additional processing, conditioning, encoding or compression of signals representing captured images may be performed at general purpose/application processor 611 or DSP(s) 612. Alternatively, a dedicated video processor 668 may perform conditioning, encoding, compression or manipulation of signals representing captured images. Additionally, video processor 668 may decode/decompress stored image data for presentation on a display device (not shown) on mobile device 600.

Mobile device 600 may also comprise sensors 660 coupled to bus 601 which may include, for example, inertial sensors and environment sensors. Inertial sensors of sensors 660 may comprise, for example accelerometers (e.g., collectively responding to acceleration of mobile device 600 in three dimensions), one or more gyroscopes or one or more magnetometers (e.g., to support one or more compass applications). Environment sensors of mobile device 600 may comprise, for example, temperature sensors, barometric pressure sensors, ambient light sensors, camera imagers, microphones, just to name few examples. Sensors 660 may generate analog or digital signals that may be stored in memory 640 and processed by DPS(s) 612 or general-purpose application processor 611 in support of one or more applications such as, for example, applications directed to positioning or navigation operations.

In a particular implementation, mobile device 600 may comprise a dedicated modem processor 666 capable of performing baseband processing of signals received and down converted at wireless transceiver 621 or SPS receiver 655. Similarly, modem processor 666 may perform baseband processing of signals to be upconverted for transmission by wireless transceiver 621. In alternative implementations, instead of having a dedicated modem processor, baseband processing may be performed by a general-purpose processor or DSP (e.g., general purpose/application processor 611 or DSP(s) 612). It should be understood, however, that these are merely examples of structures that may perform baseband processing, and that claimed subject matter is not limited in this respect.

According to an aspect of the disclosure, the mobile device 600 may comprise a wired charger and/or a wireless charger 680. As an example, this may include a power management integrated circuit, wireless charging coils, converter, etc.

The mobile device 600 also comprises one or more PCMs 690, which are described throughout the specification, and may include one or more components 695, such as actuators or nanofluids, to couple the processors 611, 612, 666, 668, PCMs 690 and/or heatsinks (not shown in figure). These PCMs may consist of organic and/or inorganic materials. Some examples of known organic PCMs include paraffins, fatty acids, polyols, polyhydric alcohols, and their derivatives, Examples of inorganic PCMs include various salt hydrates and metallic intermetallic compounds. Combinations of these and other material systems are also possible.

The PCMs may be encapsulated in one or more different materials to contain the PCM when it changes. This may be beneficial because it provides the ability to capture heat transfer, but without having the PCM potentially losing its original form.

In some implementations, PCMs may be uncontained and it is able to return to its original form. This may be because of the PCMs high viscosity or other factors. This provides the benefit of allowing the PCM to change forms and allow its surface area to cover other components that may also be needing to remove heat, so it allows the PCM to capture additional heat from these other components. For example, there may be a PCM that changes form from solid to liquid when it receives an electrical charge or after meeting a heat transfer threshold and when solid form the PCM receives heat from the CPU but when it changes to liquid it covers the CPU, CPU, baseband, memory, etc. and the PCM may be designed to receive additional heat when it is in this liquid form (up to a limit) allowing the device to function at a higher power state until it can opportunistically dissipate the heat.

Discussions of coupling between components in this specification do not require the components to be directly coupled. These components may be coupled directly or through one or more intermediaries. Additionally, coupling does not require they be directly attached, but it may also include electrically coupled, communicatively coupled or any combination thereof.

Reference throughout this specification to "one example", "an example", "certain examples", or "exemplary implementation" means that a particular feature, structure, or characteristic described in connection with the feature and/or example may be included in at least one feature and/or example of claimed subject matter. Thus, the appearances of the phrase "in one example", "an example", "in certain examples" or "in certain implementations" or other like phrases in various places throughout this specification are not necessarily all referring to the same feature, example, and/or limitation. Furthermore, the particular features, structures, or characteristics may be combined in one or more examples and/or features.

Some portions of the detailed description included herein are presented in terms of algorithms or symbolic representations of operations on binary digital signals stored within a memory of a specific apparatus or special purpose computing device or platform. In the context of this particular specification, the term specific apparatus or the like includes a general-purpose computer once it is programmed to perform particular operations pursuant to instructions from program software. Algorithmic descriptions or symbolic representations are examples of techniques used by those of ordinary skill in the signal processing or related arts to convey the substance of their work to others skilled in the art. An algorithm is here, and generally, is considered to be a self-consistent sequence of operations or similar signal processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals, or the like. It should be understood, however, that all of these or similar terms are to be associated with appropriate physical quantities and are merely convenient labels. Unless specifically stated otherwise, as apparent from the discussion herein, it is appreciated that throughout this specification discussions utilizing terms such as "processing," "computing," "calculating," "determining" or the like refer to actions or processes of a specific apparatus, such as a special purpose computer, special purpose computing apparatus or a similar special purpose electronic computing device. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or similar special purpose electronic computing device.

In another aspect, as previously mentioned, a wireless transmitter or access point may comprise a cellular transceiver device, utilized to extend cellular telephone service into a business or home. In such an implementation, one or more mobile devices may communicate with a cellular transceiver device via a code division multiple access ("CDMA") cellular communication protocol, for example.

Techniques described herein may be used with an SPS that includes any one of several GNSS and/or combinations of GNSS. Furthermore, such techniques may be used with positioning systems that utilize terrestrial transmitters acting as "pseudolites", or a combination of SVs and such terrestrial transmitters. Terrestrial transmitters may, for example, include ground-based transmitters that broadcast a PN code or other ranging code (e.g., similar to a GPS or CDMA cellular signal). Such a transmitter may be assigned a unique PN code so as to permit identification by a remote receiver. Terrestrial transmitters may be useful, for example, to augment an SPS in situations where SPS signals from an orbiting SV might be unavailable, such as in tunnels, mines, buildings, urban canyons or other enclosed areas. Another implementation of pseudolites is known as radio-beacons. The term "SV", as used herein, is intended to include terrestrial transmitters acting as pseudolites, equivalents of pseudolites, and possibly others. The terms "SPS signals" and/or "SV signals", as used herein, is intended to include SPS-like signals from terrestrial transmitters, including terrestrial transmitters acting as pseudolites or equivalents of pseudolites.

In the preceding detailed description, numerous specific details have been set forth to provide a thorough understanding of claimed subject matter. However, it will be understood by those skilled in the art that claimed subject matter may be practiced without these specific details. In other instances, methods and apparatuses that would be known by one of ordinary skill have not been described in detail so as not to obscure claimed subject matter.

The terms, "and", "or", and "and/or" as used herein may include a variety of meanings that also are expected to depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein may be used to describe any feature, structure, or characteristic in the singular or may be used to describe a plurality or some other combination of features, structures or characteristics. Though, it should be noted that this is merely an illustrative example and claimed subject matter is not limited to this example.

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein.

Therefore, it is intended that claimed subject matter not be limited to the particular examples disclosed, but that such claimed subject matter may also include all aspects falling within the scope of appended claims, and equivalents thereof.

For an implementation involving firmware and/or software, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a computer-readable storage medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage, semiconductor storage, or other storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media. In addition to storage on computer-readable storage medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims. That is, the communication apparatus includes transmission media with signals indicative of information to perform disclosed functions. At a first time, the transmission media included in the communication apparatus may include a first portion of the information to perform the disclosed functions, while at a second time the transmission media included in the communication apparatus may include a second portion of the information to perform the disclosed functions.

What is claimed is:

1. An apparatus for mitigating temperature spikes and dissipating heat, comprising:
   one or more heatsinks;
   one or more sensors;
   one or more phase change materials;
   one or more processors coupled to the one or more sensors, wherein at least one processor of the one or more processors is configured to:
     obtain one or more sensor measurements from the one or more sensors;
     determine whether to dissipate heat based on the one or more sensor measurements; and
     in response to the determination to dissipate heat, dissipate heat from the one or more processors, the one or more phase change materials or both by coupling the one or more processors, the one or more phase change materials or both to the one or more heatsinks.

2. The apparatus of claim 1, wherein the at least one processor configured to couple the one or more processors, the one or more phase change materials or both to the one or more heatsinks comprises the one or more processors configured to thermally couple the one or more processors, the one or more phase change materials or both to the one or more heatsinks.

3. The apparatus of claim 1, wherein the at least one processor is further configured to:
   in response to the determination to dissipate heat, determine an estimated time to dissipate heat based on the one or more sensor measurements; and
   wherein the coupling of the one or more processors, the one or more phase change materials or both to the one or more heatsinks is performed at the estimated time.

4. The apparatus of claim 1, wherein the one or more sensor measurements comprise: heart rate, blood flow, lymph flow, cerebrospinal flow, pulse shape, heatsink temperature, body temperature, gyroscope data, accelerometer data, or any combination thereof.

5. The apparatus of claim 1, wherein the at least one processor configured to couple the one or more processors, the one or more phase change materials or both to the one or more heatsinks is performed using one or more actuators, one or more nanofluids, or both.

6. The apparatus of claim 1, wherein the at least one processor is further configured to: in response to the determination to dissipate heat, identify at least one heatsink to use from the one or more heatsinks based on a second set of sensor measurements and dissipate heat from the one or more processors, the one or more phase change materials or both by coupling the one or more processors, the one or more phase change materials or both to the identified at least one heatsink.

7. The apparatus of claim 6, wherein the second set of sensor measurements comprise: temperature associated with each heatsink corresponding to a location where a user may be touching the apparatus, current heat storage amount at each phase change material, current heat storage amount at each processor, or any combination thereof.

8. An apparatus for mitigating temperature spikes and dissipating heat, comprising:
   one or more heatsinks;
   one or more sensors;
   one or more phase change materials;
   one or more processors coupled to the one or more sensors, wherein at least one processor of the one or more processors is configured to:
     obtain one or more sensor measurements from the one or more sensors;
     determine whether to store heat based on the one or more sensor measurements; and
     in response to the determination to store heat, store heat from the one or more processors by coupling the one or more processors to the one or more phase change materials.

9. The apparatus of claim 8, wherein the at least one processor is further configured to couple to the one or more phase change materials using one or more actuators, one or more nanofluids, or both.

10. A method for mitigating temperature spikes and dissipating heat, the method comprising:
    obtaining one or more sensor measurements;
    determining whether to dissipate heat based on the one or more sensor measurements; and
    dissipating heat from one or more processors, one or more phase change materials or both based on the determination whether to dissipate heat by coupling the one or more processors, the one or more phase change materials or both to the one or more heatsinks.

11. The method of claim 10, wherein the coupling the one or more processors, the one or more phase change materials or both to the one or more heatsinks comprises thermally coupling the one or more processors, the one or more phase change materials or both to the one or more heatsinks.

12. The method of claim 10, wherein: in response to the determination to dissipate heat, determining an estimated time to dissipate heat based on the one or more sensor measurements; and wherein the coupling the one or more processors, the one or more phase change materials or both to the one or more heatsinks is performed at the estimated time.

13. The method of claim 10, wherein the one or more sensor measurements comprise: heart rate, blood flow, lymph flow, cerebrospinal flow, pulse shape, heatsink temperature, body temperature, gyroscope data, accelerometer data, or any combination thereof.

14. The method of claim 10, wherein the coupling the one or more processors, the one or more phase change materials or both to the one or more heatsinks is performed using one or more actuators, one or more nanofluids or both.

15. The method of claim 10, wherein: in response to the determination to dissipate heat, identifying at least one heatsink to use from the one or more heatsinks based on a second set of sensor measurements; and dissipating heat from the one or more processors, the one or more phase change materials or both by coupling the one or more processors, the one or more phase change materials or both to the identified at least one heatsink.

16. The method of claim 15, wherein the second set of sensor measurements comprise: temperature associated with each heatsink corresponding to a location where a user may be touching a device, temperature associated with each heatsink, current heat storage amount at each phase change material, current heat storage amount at each processor, or any combination thereof.

17. A method for mitigating temperature spikes and dissipating heat, the method comprising:
obtaining one or more sensor measurements;
determining whether to dissipate heat based on the one or more sensor measurements; and
in response to the determination to not dissipate heat, storing heat from the one or more processors using the one or more phase change materials by coupling the one or more processors to the one or more phase change materials.

18. The method of claim 17, wherein the coupling the one or more processors to the one or more phase change materials is performed using one or more actuators, one or more nanofluids or both.

19. An apparatus for mitigating temperature spikes and opportunistically dissipating heat, the apparatus comprising:
means for obtaining one or more sensor measurements;
means for determining whether to dissipate heat based on the one or more sensor measurements; and
in response to the determination to dissipate heat, means for dissipating heat from one or more processors, one or more phase change materials or both via a means for coupling the one or more processors, the one or more phase change materials or both to one or more heatsinks.

20. The apparatus of claim 19, wherein the means for coupling comprises means for thermally coupling the one or more processors, the one or more phase change materials or both to the one or more heatsinks.

21. The apparatus of claim 19, further comprising:
in response to the determination to dissipate heat, means for determining an estimated time to dissipate heat based on the one or more sensor measurements; and
wherein the means for coupling is performed at the estimated time.

22. The apparatus of claim 19, wherein the one or more sensor measurements comprise: heart rate, blood flow, lymph flow, cerebrospinal flow, pulse shape, heatsink temperature, body temperature, gyroscope data, accelerometer data, or any combination thereof.

23. The apparatus of claim 19, wherein the means for coupling the one or more processors, the one or more phase change materials or both to the one or more heatsinks is performed using one or more actuators, one or more nanofluids or both.

24. The apparatus of claim 19, further comprising:
in response to the determination to dissipate heat, means for identifying at least one heatsink to use from the one or more heatsinks based on a second set of sensor measurements; and
means for dissipating heat from the one or more processors, the one or more phase change materials or both further via means for coupling the one or more processors, the one or more phase change materials or both to the identified at least one heatsink.

25. The apparatus of claim 24, wherein the second set of sensor measurements comprise: temperature associated with each heatsink corresponding to a location where a user may be touching the apparatus, temperature associated with each heatsink, current heat storage amount at each phase change material, current heat storage amount at each processor, or any combination thereof.

26. An apparatus for mitigating temperature spikes and opportunistically dissipating heat, the apparatus comprising:
means for obtaining one or more sensor measurements;
means for determining whether to store heat based on the one or more sensor measurements; and
in response to the determination to store heat, means for storing heat from the one or more processors via a means for coupling the one or more processors to the one or more phase change materials.

27. The apparatus of claim 26, wherein the means for coupling the one or more processors to the one or more phase change materials is performed using one or more actuators, one or more nanofluids or both.

28. A non-transitory computer-readable medium for mitigating temperature spikes and dissipating heat comprising processor-executable program code configured to cause a processor to:
obtain one or more sensor measurements from one or more sensors;
determine whether to dissipate heat based on the one or more sensor measurements; and
in response to the determination to dissipate heat, dissipate heat from one or more processors, one or more phase change materials or both by coupling the one or more processors, the one or more phase change materials or both to one or more heatsinks.

29. The non-transitory computer-readable medium of claim 28, wherein the processor-executable program code is configured to cause the processor to couple the one or more processors, the one or more phase change materials or both to the one or more heatsinks comprises thermally couple the one or more processors, the one or more phase change materials or both to the one or more heatsinks.

30. The non-transitory computer-readable medium of claim 28, wherein the processor-executable program code is further configured to:
in response to the determination to dissipate heat, determine an estimated time to dissipate heat based on the one or more sensor measurements; and
wherein the coupling of the one or more processors, the one or more phase change materials or both to the one or more heatsinks is performed at the estimated time.

31. The non-transitory computer-readable medium of claim 28, wherein the one or more sensor measurements may comprise: heart rate, blood flow, lymph flow, cerebrospinal flow, pulse shape, heatsink temperature, body temperature, gyroscope data, accelerometer data, or any combination thereof.

32. The non-transitory computer-readable medium of claim 28, wherein the processor-executable program code to couple the one or more processors, the one or more phase change materials or both to the one or more heatsinks is performed using one or more actuators, one or more nanofluids or both.

33. The non-transitory computer-readable medium of claim 28, wherein the processor-executable program code is further configured to in response to the determination to dissipate heat, identify at least one heatsink to use from the one or more heatsinks based on a second set of sensor measurements and dissipate heat from the one or more processors, the one or more phase change materials or both by coupling the one or more processors, the one or more phase change materials or both to the identified at least one heatsink.

34. The non-transitory computer-readable medium of claim 33, wherein the second set of sensor measurements may comprise: temperature associated with each heatsink corresponding to a location where a user may be touching a device, temperature associated with each heatsink, current heat storage amount at each phase change material, current heat storage amount at each processor, or any combination thereof.

35. A non-transitory computer-readable medium for mitigating temperature spikes and dissipating heat comprising processor-executable program code configured to cause a processor to:

obtain one or more sensor measurements from one or more sensors;

determine whether to store heat based on the one or more sensor measurements; and in response to the determination to store heat, store heat from the one or more processors by coupling the one or more processors to the one or more phase change materials.

36. The non-transitory computer-readable medium of claim 35, wherein the processor-executable program code further configured to cause the one or more processors to couple to the one or more phase change materials using one or more actuators, one or more nanofluids or both.

\* \* \* \* \*